(12) United States Patent
Busch et al.

(10) Patent No.: US 8,030,168 B2
(45) Date of Patent: Oct. 4, 2011

(54) METHODS OF FORMING DRAM MEMORY CELLS

(75) Inventors: Brett W. Busch, Boise, ID (US); David K. Hwang, Boise, ID (US); F. Daniel Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 115 days.

(21) Appl. No.: 12/419,014

(22) Filed: Apr. 6, 2009

(65) Prior Publication Data

US 2009/0197386 A1 Aug. 6, 2009

Related U.S. Application Data

(62) Division of application No. 11/131,555, filed on May 18, 2005, now abandoned.

(51) Int. Cl.
*H01L 21/8242* (2006.01)

(52) U.S. Cl. ........ 438/396; 438/244; 438/253; 438/387; 438/618; 977/773; 257/E21.586; 257/E21.658

(58) Field of Classification Search .......... 257/306–309; 977/773
See application file for complete search history.

(56) References Cited

U.S. PATENT DOCUMENTS

| | | | |
|---|---|---|---|
| 5,332,910 A | 7/1994 | Haraguchi et al. | |
| 5,956,594 A * | 9/1999 | Yang et al. | 438/396 |
| 6,297,063 B1 | 10/2001 | Brown et al. | |
| 6,383,923 B1 | 5/2002 | Brown et al. | |
| 6,806,228 B2 | 10/2004 | Sharma et al. | |
| 7,105,428 B2 | 9/2006 | Pan et al. | |
| 7,335,908 B2 | 2/2008 | Samuelson et al. | |
| 7,339,186 B2 | 3/2008 | Mio et al. | |
| 2002/0024085 A1 * | 2/2002 | Nakamura et al. | 257/306 |
| 2004/0023471 A1 | 2/2004 | Adu et al. | |
| 2004/0144970 A1 | 7/2004 | Wang et al. | |
| 2005/0011431 A1 | 1/2005 | Samuelson et al. | |

OTHER PUBLICATIONS

Bhunia et al., "Metalorganic vapor-phase epitaxial growth and characterization of vertical InP nanowires", Appl. Phys. Lett., vol. 83, No. 16, pp. 3371-3373 (Oct. 20, 2003).
Bjork et al., "One-dimensional heterostructures in semiconductor nanowhiskers", Appl. Phys. Lett., vol. 80, No. 6 pp. 1058-1060 (Feb. 11, 2002).
Ohlsson et al., "Size-, shape-, and position-controlled GaAs nanowhiskers", Appl. Phys. Lett., vol. 79, No. 20, pp. 3335-3337 (Nov. 12, 001). Ozaki et al., "Silicon nanowhiskers grown on a hydrogen-terminated silicon (111) surface", Appl. Phys. Lett., vol. 73, No. 25, pp. 3700-3702 (Dec. 21, 1998).
Schubert et al., "Silicon nanowhiskers grown on (111) Si substrates by molecular-beam epitaxy", Appl. Phys. Lett., vol. 84, No. 24, pp. 4968-4970 (Mar. 10, 2003).
Tu et al., "Self-assembled vertical GaN nanorods grown by molecular-beam epitaxy", Appl. Phys. Lett., vol. 82, No. 10, pp. 1601-1603 (Mar. 10, 2003).

* cited by examiner (Continued)

*Primary Examiner* — Thanh Nguyen
(74) *Attorney, Agent, or Firm* — Wells St. John P.S.

(57) ABSTRACT

The invention includes methods of electrically interconnecting different elevation conductive structures, methods of forming capacitors, methods of forming an interconnect between a substrate bit line contact and a bit line in DRAM, and methods of forming DRAM memory cells. In one implementation, a method of electrically interconnecting different elevation conductive structures includes forming a first conductive structure comprising a first electrically conductive surface at a first elevation of a substrate. A nanowhisker is grown from the first electrically conductive surface, and is provided to be electrically conductive. Electrically insulative material is provided about the nanowhisker. An electrically conductive material is deposited over the electrically insulative material in electrical contact with the nanowhisker at a second elevation which is elevationally outward of the first elevation, and the electrically conductive material is provided into a second conductive structure. Other aspects and implementations are contemplated.

31 Claims, 20 Drawing Sheets

$\mathbb{F}I\mathbb{G}\ \exists$

METHODS OF FORMING DRAM MEMORY CELLS

RELATED PATENT DATA

This application is a divisional application of U.S. patent application Ser. No. 11/131,555 filed on May 18, 2005 now abandoned entitled "Methods of Electrically Interconnecting Different Elevation Conductive Structures, Methods of Forming Capacitors, Methods of Forming an Interconnect Between a Substrate Bit Line Contact and a Bit Line in DRAM, and Methods of Forming DRAM Memory Cells", naming Brett W. Busch, David K. Hwang, and F. Daniel Gealy as inventors, and the disclosure of which if hereby fully incorporated by reference.

TECHNICAL FIELD

This invention relates to methods of electrically interconnecting different elevation conductive structures, to methods of forming capacitors, to methods of forming an interconnect between a substrate bit line contact and a bit line in DRAM, and to methods of forming DRAM memory cells.

BACKGROUND OF THE INVENTION

A continuing goal in integrated circuitry fabrication is to form the circuitry components to be smaller and denser over a given area of a semiconductor substrate. One common circuit device is a capacitor, which has a capacitor dielectric region received between a pair of conductive electrodes. In such devices, there is a continuing challenge to maintain sufficiently high storage capacitance despite decreasing area in the denser circuits. Additionally, there is a continuing goal to further decrease cell area. One common place where capacitors are utilized in dense arrays is in dynamic random access memory (DRAM) circuitry. Challenges in the fabrication of DRAM and other circuitry also exist, for example in electrically connecting different elevation conductive structures.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of electrically interconnecting different elevation conductive structures, methods of forming capacitors, methods of forming an interconnect between a substrate bit line contact and a bit line in DRAM, and methods of forming DRAM memory cells. In one implementation, a method of electrically interconnecting different elevation conductive structures includes forming a first conductive structure comprising a first electrically conductive surface at a first elevation of a substrate. A nanowhisker is grown from the first electrically conductive surface, and is provided to be electrically conductive. Electrically insulative material is provided about the nanowhisker. An electrically conductive material is deposited over the electrically insulative material in electrical contact with the nanowhisker at a second elevation which is elevationally outward of the first elevation, and the electrically conductive material is provided into a second conductive structure.

In one implementation, a method of forming a capacitor includes growing a nanowhisker from a surface of a substrate, and providing the nanowhisker to be electrically conductive. The nanowhisker comprises sidewalls and comprises a first capacitor electrode. A capacitor dielectric layer is formed over the nanowhisker sidewalls. A second capacitor electrode is formed over the capacitor dielectric layer.

In one implementation, a method of forming a capacitor includes growing a nanowhisker from a surface of a substrate, and providing the nanowhisker to be electrically conductive. A container-shaped first capacitor electrode is formed in electrical contact with the nanowhisker. A capacitor dielectric layer is formed over the container-shaped first capacitor electrode. A second capacitor electrode is formed over the capacitor dielectric layer.

In one implementation, a method of forming an interconnect between a substrate bit line contact and a bit line in DRAM includes forming a bit line contact intermediate a pair of wordlines over a semiconductor substrate. A nanowhisker is grown from the bit line contact, and the nanowhisker is provided to be electrically conductive. A bit line is formed in electrical contact with the nanowhisker.

In one implementation, a method of forming a DRAM memory cell includes forming a wordline over a semiconductor substrate, and forming a capacitor storage node contact proximate the wordline. A nanowhisker is grown from the capacitor storage node contact, and the nanowhisker is provided to be electrically conductive. A capacitor dielectric layer and an outer capacitor electrode layer are formed over the nanowhisker.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
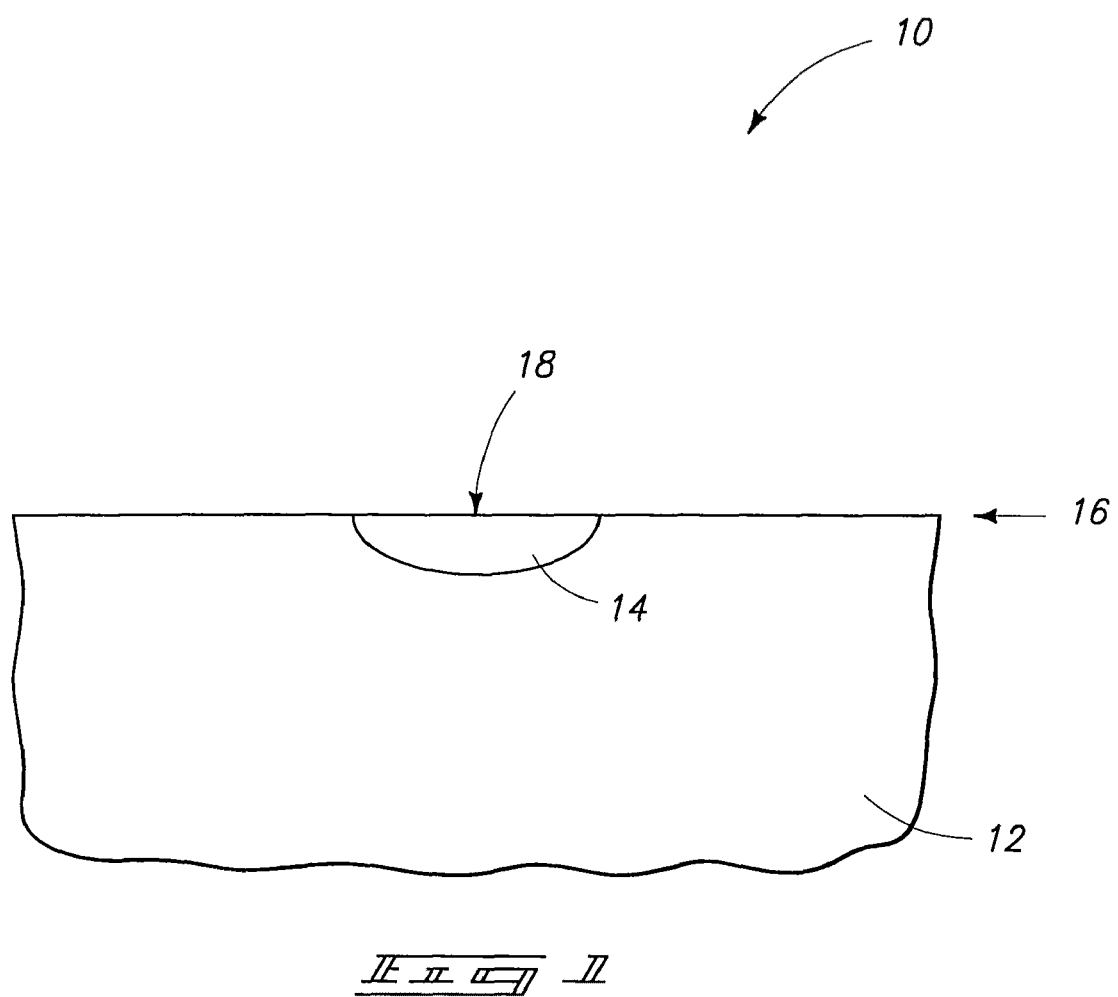
FIG. 1 is a diagrammatic sectional view of a semiconductor substrate fragment in process in accordance with an aspect of the invention.

An aspect of the invention is initially described in the context of a method of electrically interconnecting different elevation conductive structures. FIG. 1 depicts a substrate fragment 10, preferably comprising a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate fragment 10 is depicted as comprising substrate material 12 which, in one example, comprises crystalline silicon, for example bulk monocrystalline silicon and having a suitable background dopant type and concentration. Of course alternately, any alternate substrate is also contemplated, and whether existing or yet-to-be developed.

A first conductive structure 14 has been formed at a first elevation 16 of substrate 12. In the depicted exemplary embodiment, first conductive structure 14 is in the form of a conductively doped diffusion region formed in bulk monocrystalline silicon material 12. First conductive structure 14 can be considered as comprising a first electrically conductive surface 18. Any alternate or additional structures are of course contemplated.

Figure 2:
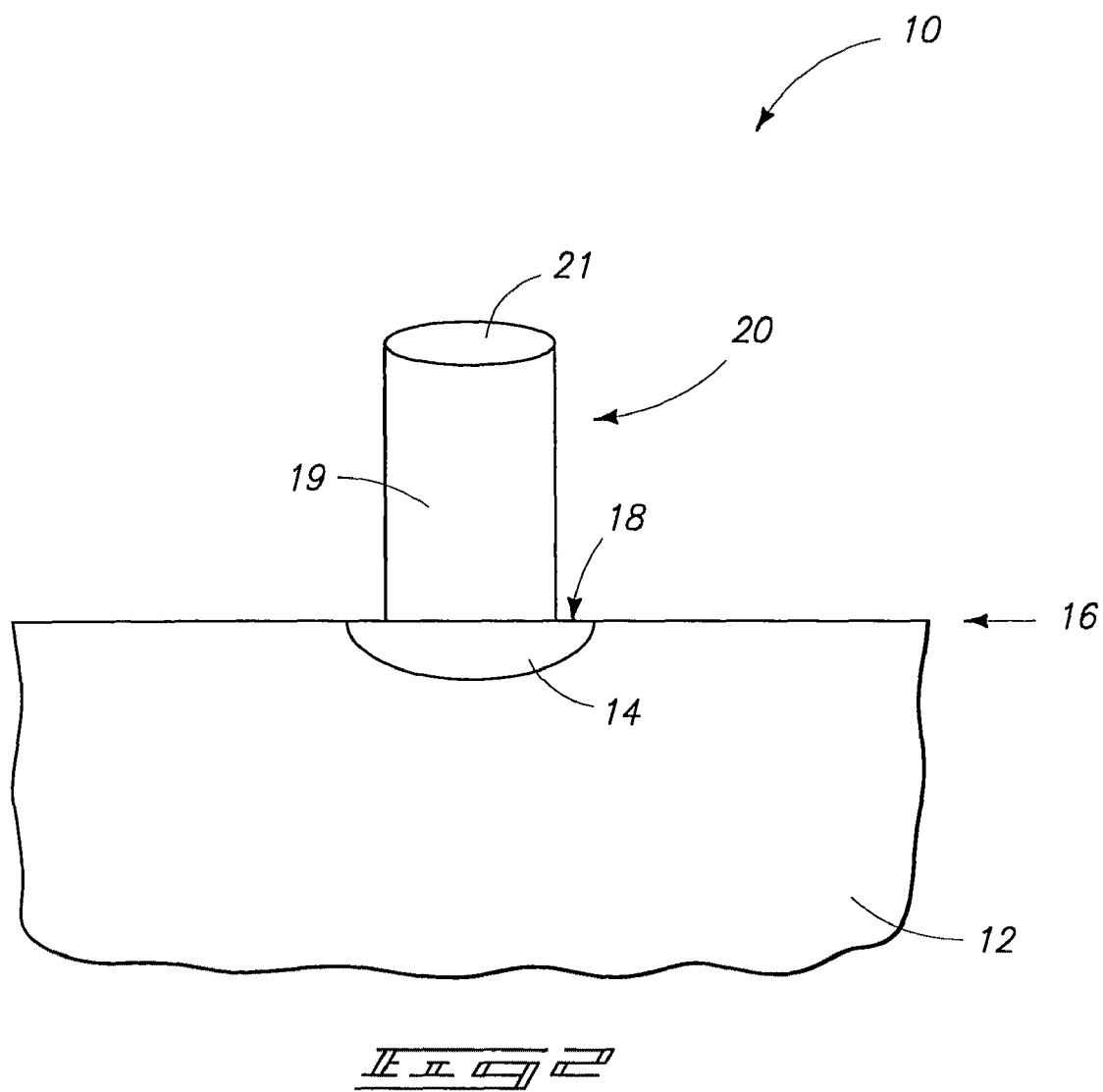
FIG. 2 is a view of the FIG. 1 substrate at a processing step subsequent to that depicted by FIG. 1.

Referring to FIG. 2, a nanowhisker 20 has been grown from first electrically conductive surface 18. In the context of this document, a nanowhisker encompasses a structure having at least two dimensions of about 100 nanometers or less, and which is fabricated by a so-called vapor-liquid-solid (VLS) mechanism, as is well known in the art and as may be modified in future developments. A particle of a catalytic material 21, usually gold, for example is provided on a substrate and is heated in the presence of certain gases to form a melt. A pillar 19 forms under the melt, and the melt rises up on top of the pillar. The result is a whisker of a desired material with the solidified particle melt positioned on top. Although the growth of nanowhiskers catalyzed by the presence of a catalytic particle/material at the tip of the growing whisker has conventionally been referred to as the VLS process, it has come to be recognized that the catalytic particle/material may not have to be in the liquid state to function as an effective catalyst for whisker growth. Evidence suggests that material for forming the whisker can reach the particle-whisker interface and contribute to the growing whisker even if the catalytic particle is at a temperature below its melting point, and presumably in the solid state. Under such conditions, the growth material, e.g., atoms that are added to the tip of the whisker as it grows, may be able to diffuse through the body of a solid catalytic particle/material, or may even diffuse along the surface of the solid catalytic particle/material to the growing tip of the whisker at the growing temperature. Evidently, the overall effect is the same, i.e., elongation of the whisker catalyzed by the catalytic particle, whatever the exact mechanism may be under particular circumstances of temperature, catalytic particle composition, intended composition of the whisker, or other conditions relevant to whisker growth. For the purposes of this application, a VLS process or VLS mechanism or equivalent terminology, is intended to include all such catalyzed procedures wherein nanowhisker growth is catalyzed by a particle/material, liquid or solid, in contact with the growing tip of the nanowhisker. Exemplary such processes are described in U.S. Patent Application Publication No. 2005/0011431 to Samuelson et al.; S. Bhunia et al., *Metalorganic vapor-phase epitaxial growth and characterization of vertical InP nanowires*, 83 APPLIED PHYSICS LETTERS, No. 16, pp. 3371-3373 (Oct. 20, 2003); M. T. Björk et al., *One-dimensional heterostructures in semiconductor nanowhiskers*, 80 APPLIED PHYSICS LETTERS, No. 6, pp. 1058-1060 (Feb. 11, 2002); B. J. Ohlsson et al., *Size-, shape-, and position-controlled GaAs nanowhiskers*, 79 Applied Physics Letters, No. 20, pp. 3335-3337 (Nov. 12, 2001); N. Ozaki et al., *Silicon nanowhiskers grown on a hydrogen-terminated silicon {111} surface*, 73 APPLIED PHYSICS LETTERS, No. 25, pp. 3700-3702 (Dec. 21, 1998); L. Schubert et al., *Silicon nanowhiskers grown on {111} Si substrates by molecular-beam epitaxy*, 84 APPLIED PHYSICS LETTERS, No. 24, pp. 4968-4970 (Jun. 14, 2004); and L. W. Tu et al., *Self-assembled vertical GaN nanorods grown by molecular-beam epitaxy*, 82 APPLIED PHYSICS LETTERS, No. 10, pp. 1601-1603 (Mar. 10, 2003), the disclosures of which are hereby incorporated by reference for their background description as to the general state of the art and exemplary preferred methods of growing a nanowhisker as described herein.

By way of example only, FIG. 2 depicts a catalytic particle/material 21, for example gold, atop underlying pillar material 19 in grown nanowhisker 20. Material 21 may or may not remain in the finished circuitry construction. Further by way of example only with respect to first conductive structure 14, nanowhisker 20 might be grown from only a portion of first electrically conductive surface 18 (as shown) or from an entirety thereof (not shown). By way of example only, an exemplary preferred diameter range for nanowhisker 20 is from 100 Angstroms to 1,000 Angstroms, and an exemplary preferred height/elevation for nanowhisker 20 is from 300 Angstroms to 30,000 Angstroms.

Nanowhisker 20 is provided to be electrically conductive. Such might inherently occur upon the growth/formation of nanowhisker 20. For example, such material might be inherently conductive upon its growth, and further might be provided to be electrically conductive, at least in part, by doping with a conductivity-enhancing dopant during the growth process. For example and by way of example only, any one of phosphorus, boron and/or arsenic components might be used in a doping gas for conductively doping a nanowhisker 20 where pillar material 19 comprises gallium arsenide or silicon. Alternately by way of example only, the nanowhisker might be provided to be electrically conductive only after its growth, and also by way of example only, by doping, at least in part, with a conductivity-enhancing dopant after the growth of nanowhisker 20.

Figure 3:
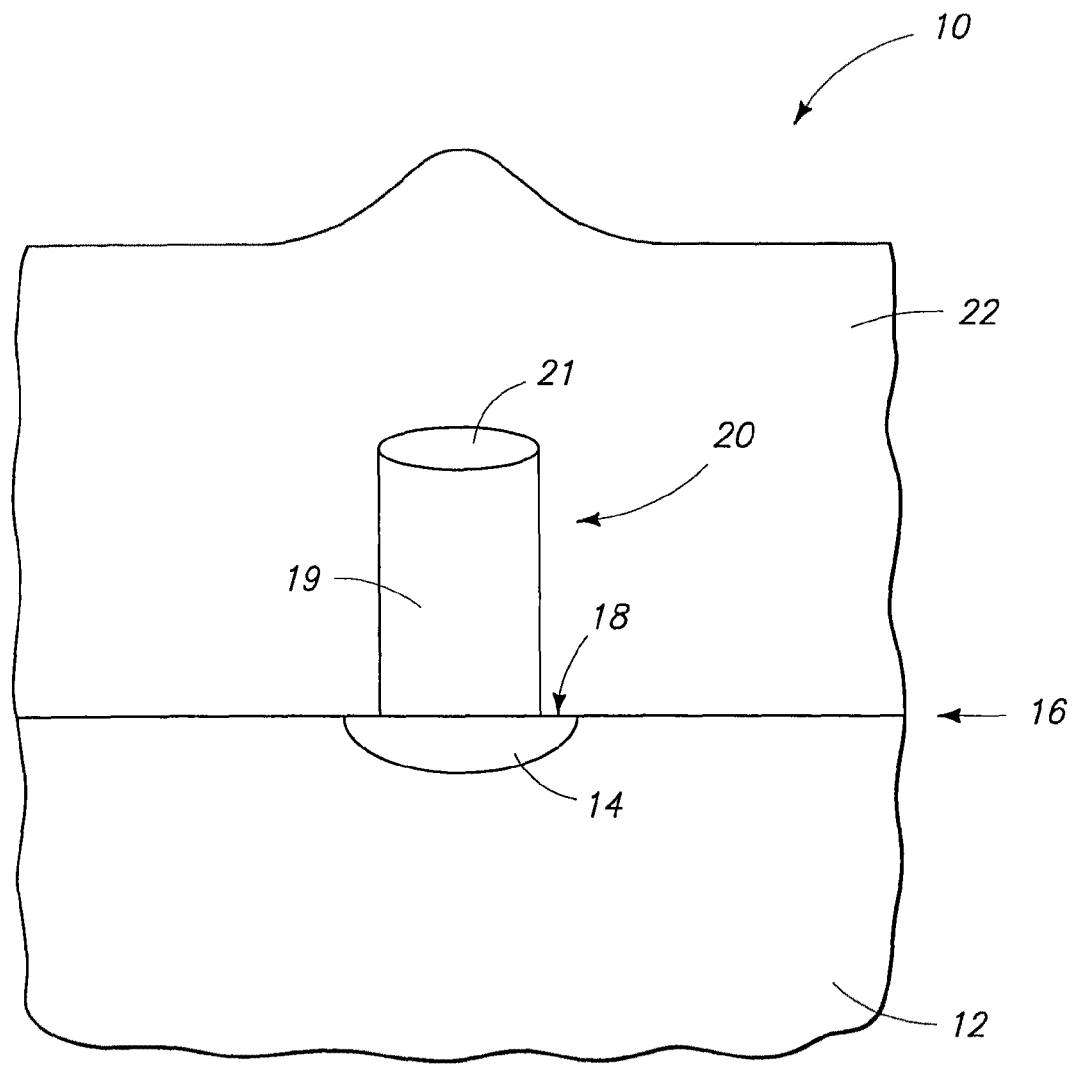
FIG. 3 is a view of the FIG. 2 substrate at a processing step subsequent to that depicted by FIG. 2.

Referring to FIG. 3, an electrically insulative material 22 has been deposited over substrate 12 and nanowhisker 20.

Exemplary preferred materials include doped and undoped silicon dioxides, for example borophosphosilicate glass (BPSG) and silicon dioxide deposited by decomposition of tetraethylorthosilicate (TEOS).

Figure 4:
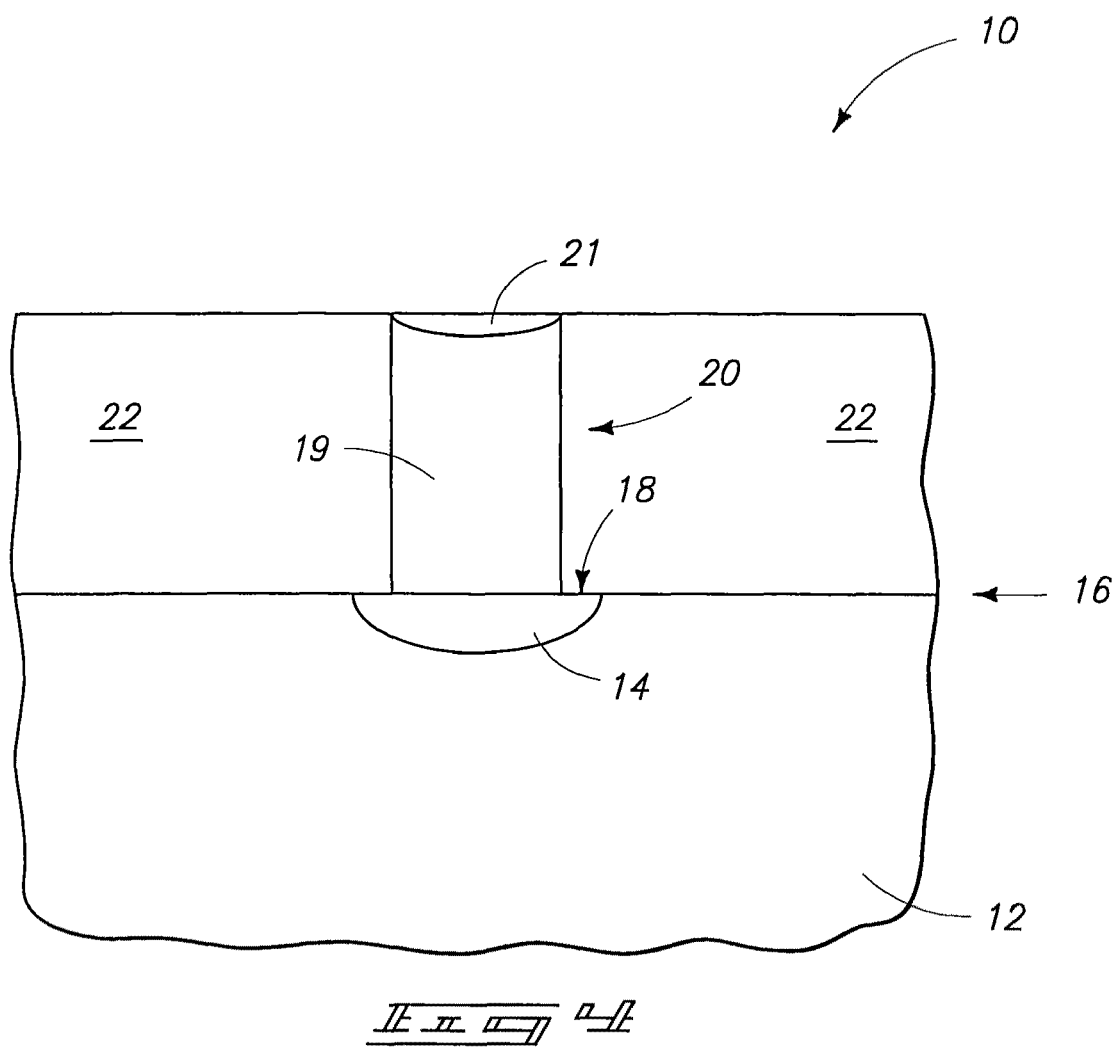
FIG. 4 is a view of the FIG. 3 substrate at a processing step subsequent to that depicted by FIG. 3.

Referring to FIG. 4, electrically insulative material 22 has been removed, preferably by polishing (i.e., chemical mechanical polishing), effective to expose nanowhisker 20. In the depicted exemplary embodiment, removal of electrically insulative material 22 has been to proximate catalytic particle/material 21 effective to at least expose the same, but not remove all of it. Alternately by way of example only, all of material 21 might be removed and perhaps some of material 19 also removed.

Figure 5:
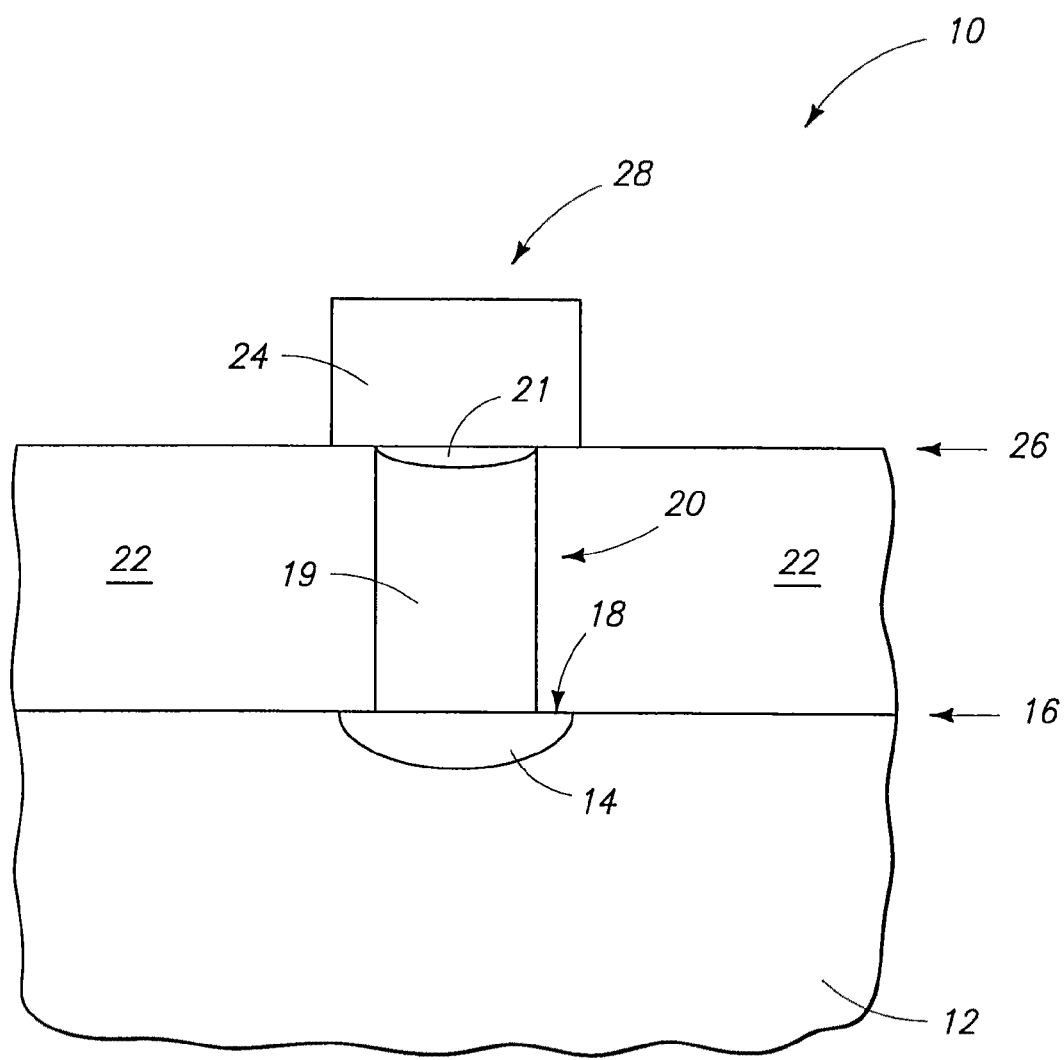
FIG. 5 is a view of the FIG. 4 substrate at a processing step subsequent to that depicted by FIG. 4.

Referring to FIG. 5, an electrically conductive material 24 has been deposited over electrically insulative material 22 in electrical contact with nanowhisker 20 at some second elevation 26 which is elevationally outward of first elevation 16. FIG. 5 depicts electrically conductive material 24 having been provided into a second conductive structure 28, for example in the depicted form of a conductive line. In the depicted exemplary FIGS. 1-5 embodiment, electrically insulative material 22 physically contacts nanowhisker 20, and electrically conductive material 24 is deposited on (with "on" in the context of this document meaning in at least some direct physical, touching, contact therewith) electrically insulative material 22.

Figure 6:
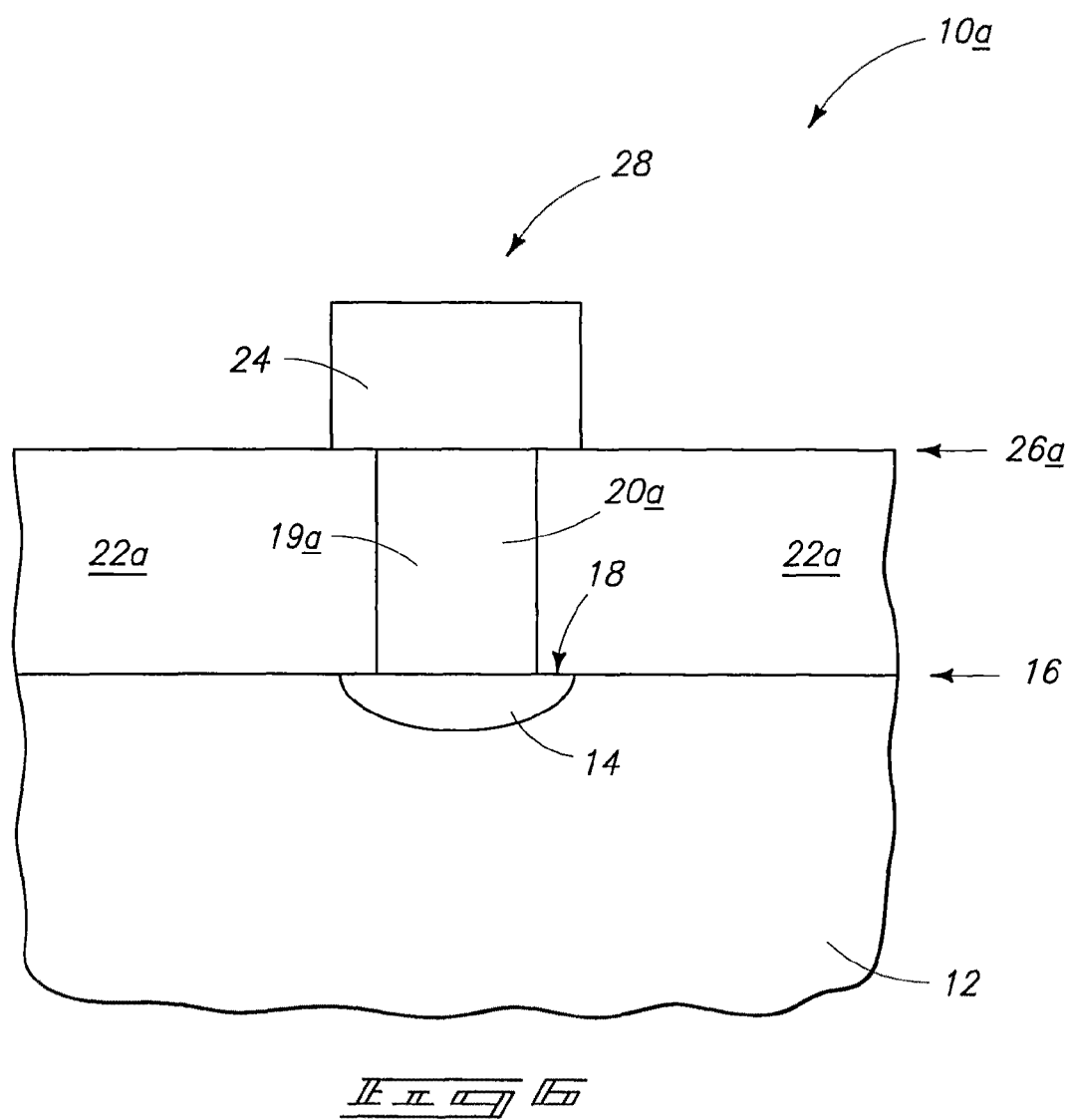
FIG. 6 is a view of an alternate embodiment substrate fragment.

The invention of course also contemplates removing some of the grown nanowhisker prior to depositing the electrically conductive material, for example as shown with respect to substrate fragment 10a in FIG. 6. Like numerals from the first-described embodiment have been utilized where appropriate, with differences being indicated with the suffix "a". By way of example only, FIG. 6 depicts the greater removal of material 22a including the removal of at least some of material 19 of nanowhisker 20a such that it is of a lesser elevation/thickness than initially grown. The embodiments of FIGS. 1-6 also depict exemplary embodiments whereby electrically insulative material 22/22a is provided about a nanowhisker 20/20a after growth of the nanowhisker.

Figure 7:
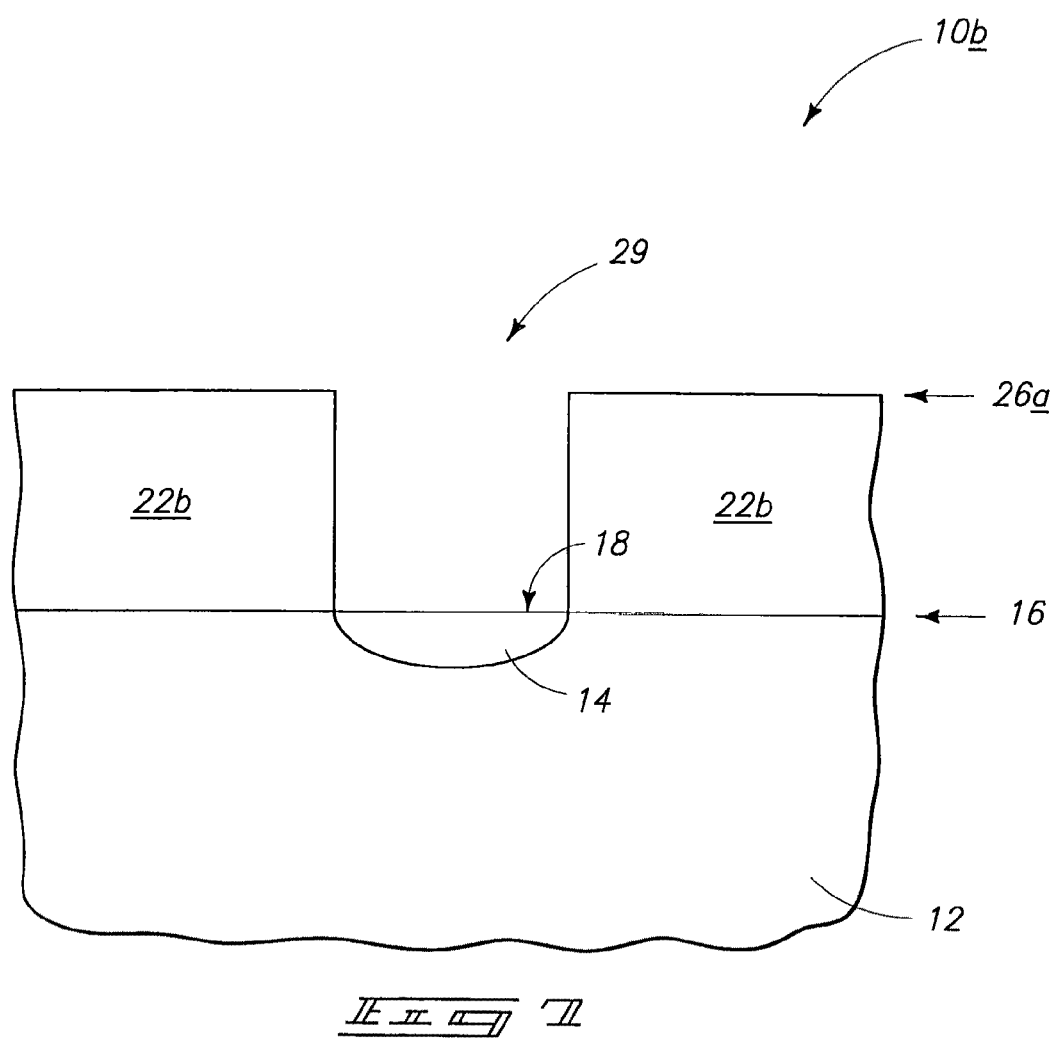
FIG. 7 is a view of another alternate embodiment substrate fragment.
Figure 8:
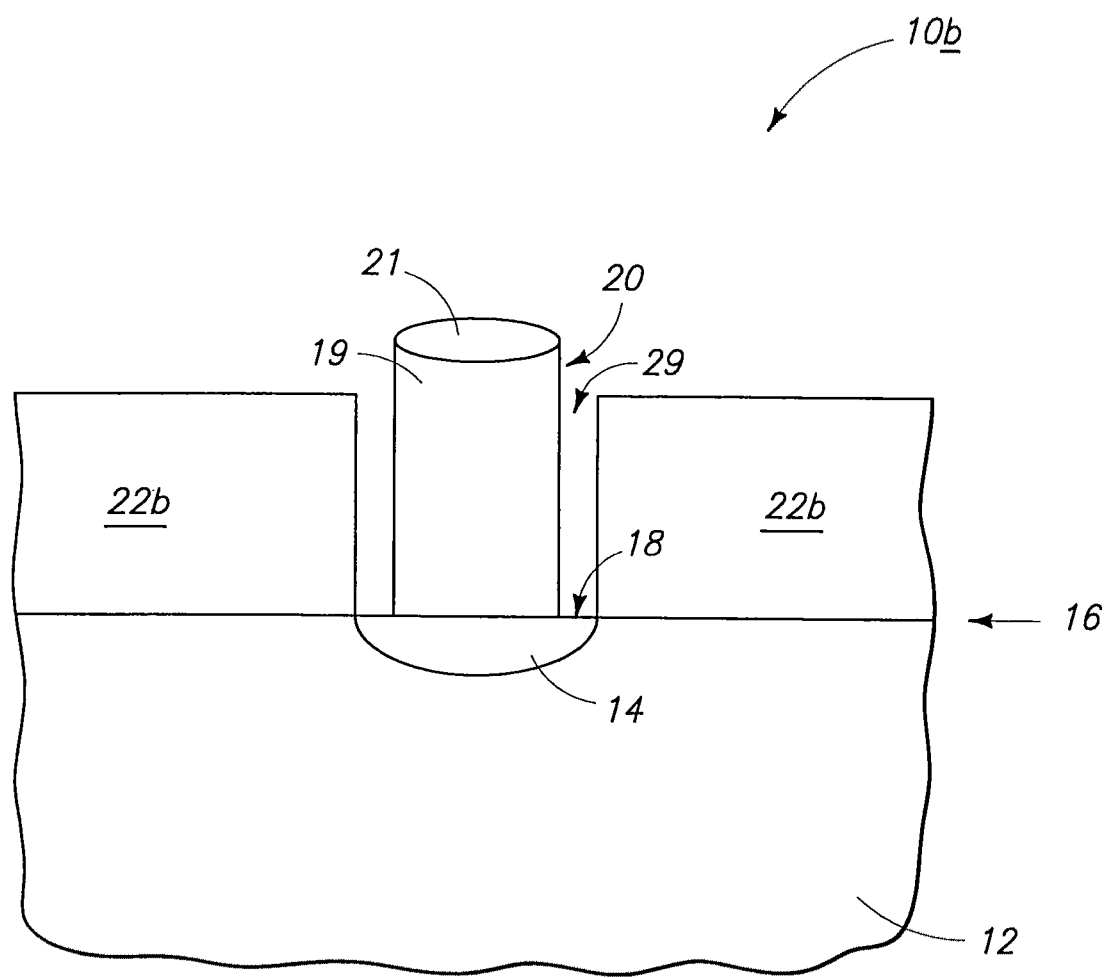
FIG. 8 is a view of the FIG. 7 substrate at a processing step subsequent to that depicted by FIG. 7.

Further, the invention also contemplates the provision of electrically insulative material about the nanowhisker in a manner whereby such material is provided prior to formation of the nanowhisker. By way of example only, a first exemplary embodiment of the same is described in connection with FIGS. 7 and 8, with respect to a substrate fragment 10b. Like numerals from the first-described embodiment have been utilized where appropriate, with differences being indicated with the suffix "b" or with different numerals. In FIG. 7, electrically insulative material 22b has been deposited over substrate 12, and an opening 29 has been formed therewithin to first electrically conductive surface 18 prior to growth of any nanowhisker therefrom. FIG. 8 depicts growth of a nanowhisker 20 utilizing a catalytic particle/material 21 which is received within opening 29 intermediate and spaced from the sidewalls of such opening.

Figure 9:
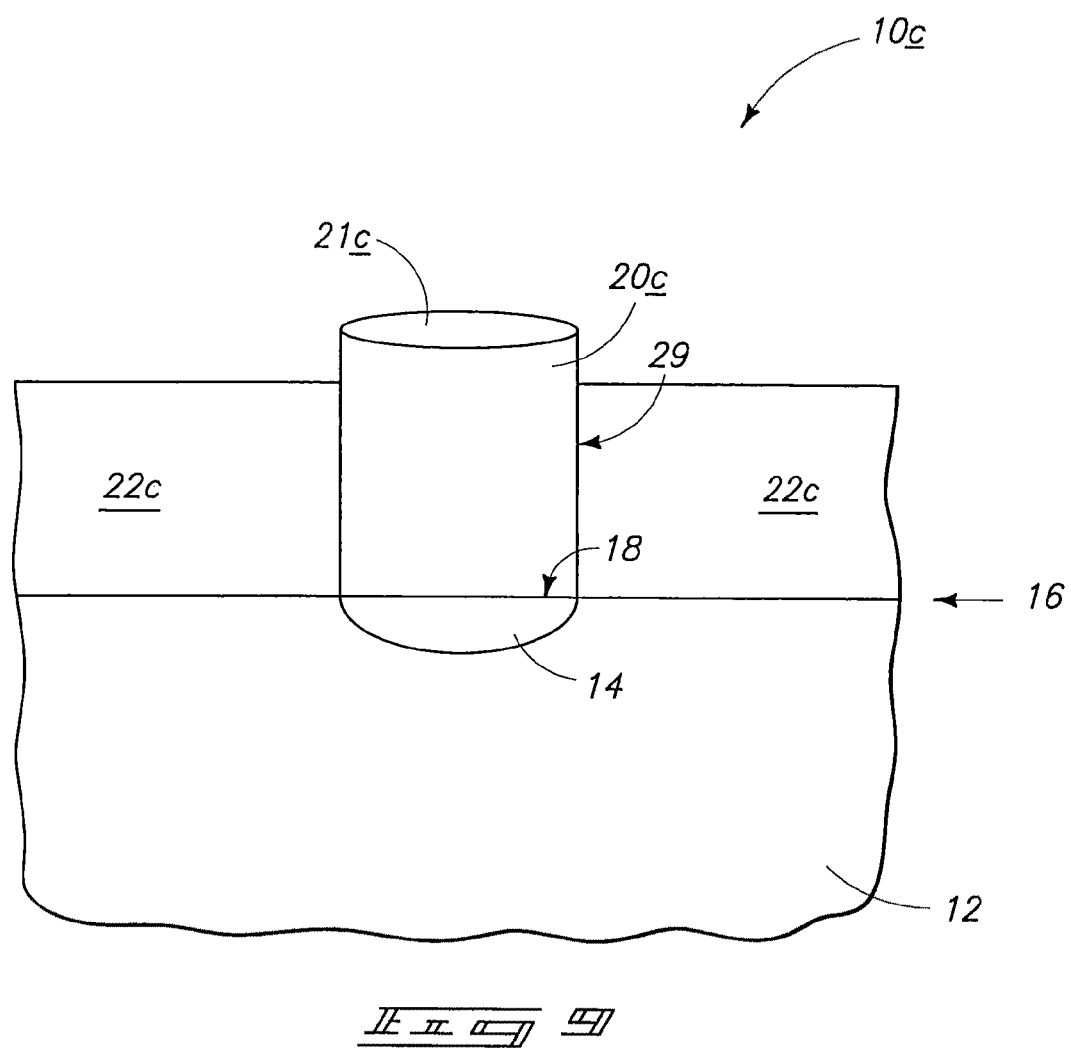
FIG. 9 is a view of another alternate embodiment substrate fragment.

FIG. 9 depicts yet another alternate exemplary embodiment substrate fragment 10c. Like numerals from the first-described embodiment have been utilized where appropriate, with differences being indicated with the suffix "c". In FIG. 9, catalytic particle/material 21c has been provided to essentially span all of opening 29 such that the resultant nanowhisker 20c spans the entirety of the depicted opening 29. The FIGS. 7-9 embodiments depict implementations wherein a nanowhisker is grown to an elevation outwardly of the previously-deposited insulative layer. Of course, alternative embodiments are contemplated, for example wherein the nanowhisker is grown to a lesser thickness to that of the electrically insulative material, or to the same thickness as that of the electrically insulative material.

Figure 10:
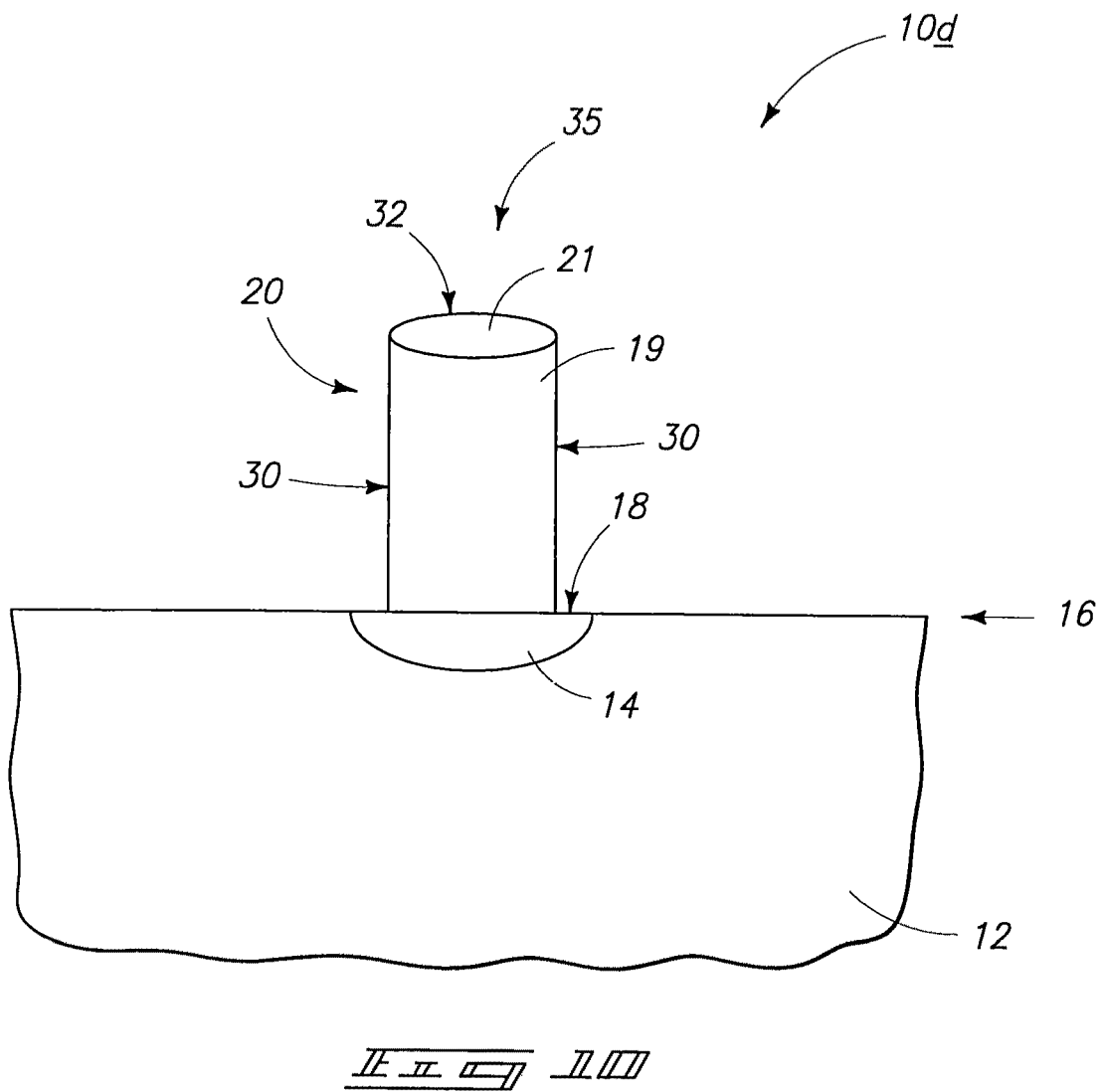
FIG. 10 is a view of another alternate embodiment substrate fragment.

Aspects of the invention also include implementations and methods of forming capacitors. By way of example only, a first such exemplary embodiment is shown and described in FIGS. 10 and 11 with reference to a substrate fragment 10d. Like numerals from the first-described embodiment have been utilized where appropriate, with differences being indicated with the suffix "d", or with different numerals. FIG. 10 depicts a substrate similar to that of FIG. 1, and with a nanowhisker 20 grown from a surface 18 of a substrate 12 in a like manner to that of FIG. 2. However, any substrate and substrate surface is contemplated, as well as any method of growing a nanowhisker, with the above-described first embodiment being but one exemplary preferred technique. As in the above-described first embodiment, nanowhisker 20 is at some point provided to be electrically conductive, and can be considered as comprising sidewalls 30 and a top 32. In the depicted exemplary embodiment, top 32 comprises catalytic particle/material 21 which is typically electrically conductive. Alternately, top 32 might be formed of nanowhisker material 19 in the absence of catalytic particle/material 21 (i.e., after such has been removed.) Further, a conductive layer (not shown), for example an elemental metal or a conductive metal compound such as TiN, might be deposited over nanowhisker 20 after its growth. Nanowhisker 20 can be considered as comprising or encompassing a first capacitor electrode 35.

Figure 11:
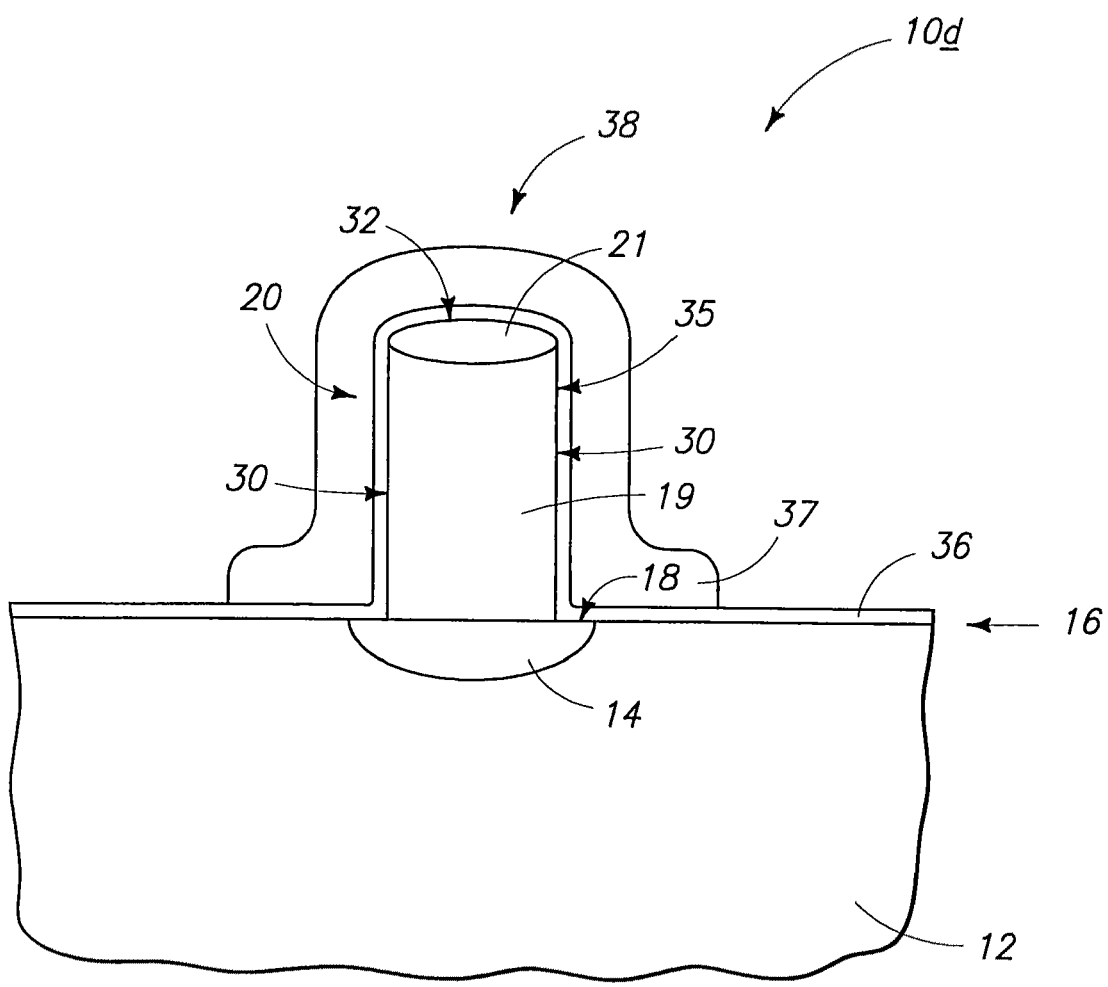
FIG. 11 is a view of the FIG. 10 substrate at a processing step subsequent to that depicted by FIG. 10.

Referring to FIG. 11, a capacitor dielectric layer 36 has been formed over at least nanowhisker sidewalls 30, and in the depicted preferred embodiment also over nanowhisker top 32. Exemplary preferred materials include silicon nitride and high k capacitor dielectrics such as barium strontium titanate, and others, and whether existing or yet-to-be developed. An exemplary second capacitor electrode 37 has been formed over capacitor dielectric layer 36. Such has been patterned, by way of example only, such that an exemplary embodiment capacitor 38 results. Alternate constructions are contemplated, of course, whether existing or yet-to-be developed, which comprise a first capacitor electrode comprising a grown nanowhisker.

Figure 12:
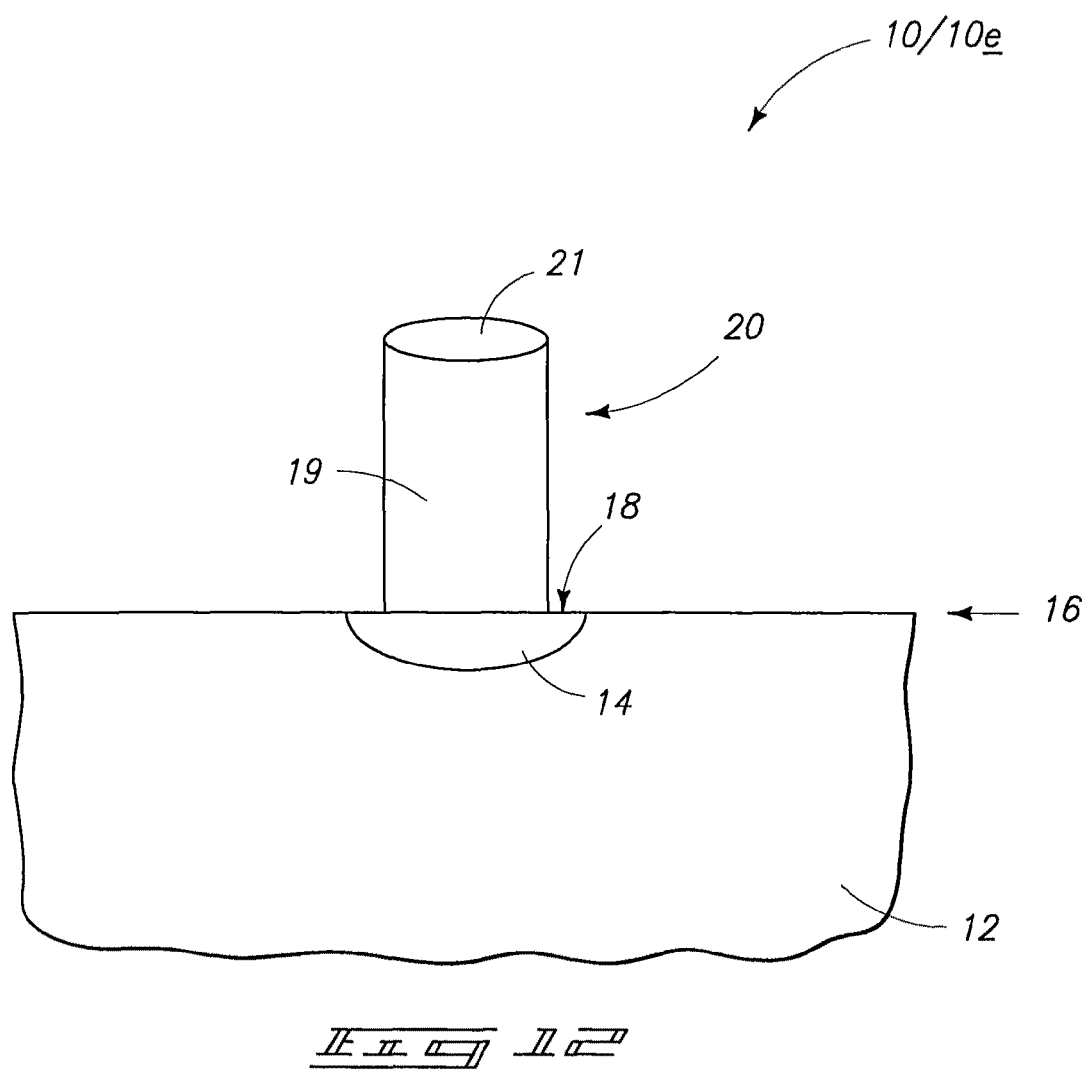
FIG. 12 is a view of another alternate embodiment substrate fragment.

An alternate exemplary embodiment of a method of forming a capacitor is described, by way of example only, with respect to FIGS. 12-15, with respect to a substrate fragment 10e. Like numerals from the first-described embodiment have been utilized where appropriate, with differences being indicated with the suffix "e", or with different numerals. FIG. 12 is analogous to the embodiment of FIG. 10 wherein a nanowhisker 20 has been grown from a surface 18 of a substrate 12, and ultimately provided to be electrically conductive. Any alternate surface and substrate are contemplated whereby a nanowhisker is grown therefrom, and whether existing or yet-to-be developed.

Figure 13:
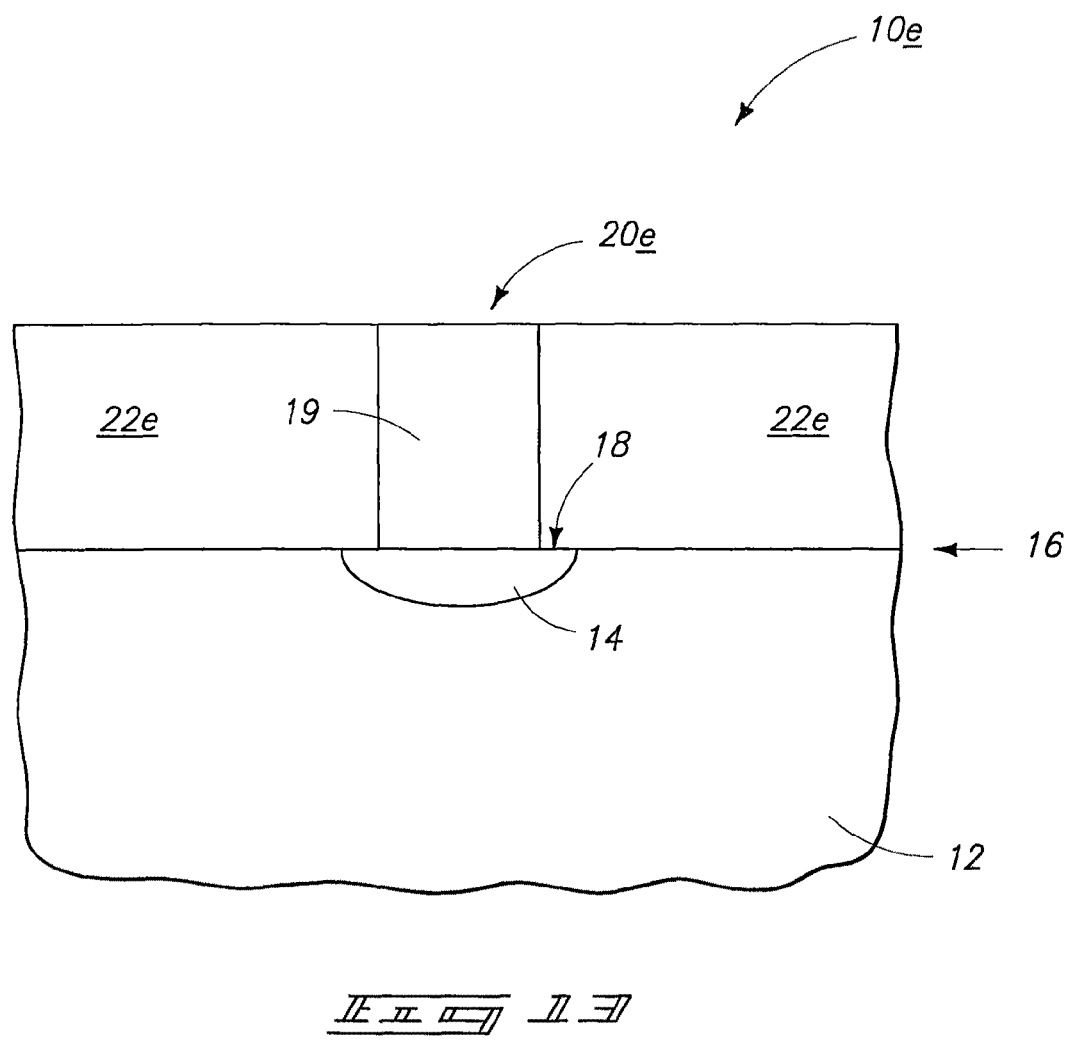
FIG. 13 is a view of the FIG. 12 substrate at a processing step subsequent to that depicted by FIG. 12.

Referring to FIG. 13, electrically insulative material 22e has been deposited and a portion thereof subsequently removed (i.e., by polishing, for example by chemical mechanical polishing) effective to outwardly expose nanowhisker 20e, such being in this exemplary embodiment somewhat analogous to the embodiment depicted in FIG. 6 with respect to electrically insulative material 22a and grown nanowhisker 20a. Accordingly in this depicted exemplary embodiment, the removal of insulative material 22e is effective to remove catalyst particle/material 21 (not shown in FIG. 13) in the depicted grown nanowhisker 20e. Alternately by way of example only, other embodiments are contemplated for example wherein the resultant grown nanowhisker retains/contains some or all of catalytic material 21. Regardless and accordingly, FIG. 13 by way of example only depicts an embodiment whereby some of the grown nanowhisker 20*e* has been removed prior to subsequent processing.

Figure 14:
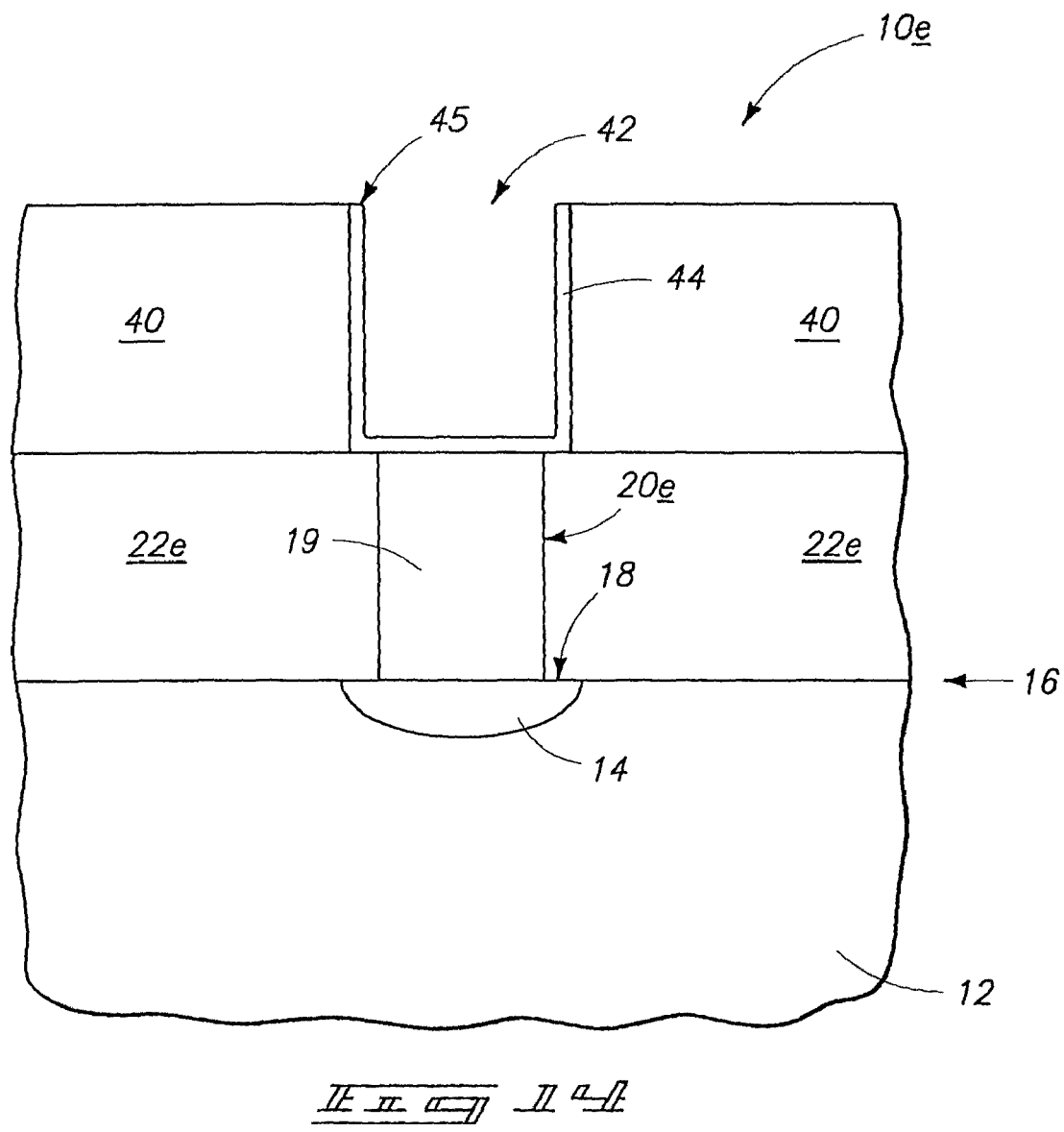
FIG. 14 is a view of the FIG. 13 substrate at a processing step subsequent to that depicted by FIG. 13.

Referring to FIG. 14, another electrically insulative layer 40 has been deposited, and an opening 42 formed therein to nanowhisker 20*e*. Material 40 might be the same as or different from that of material 22/22*e*, and of course etch stop and/or other additional layers might be utilized. A conductive layer 44 has been deposited within opening 42 to less than fill such opening, and in the exemplary embodiment has been polished back to be isolated therewithin thereby, in but one exemplary embodiment, forming a container-shaped first capacitor electrode 45 which is in electrical contact with nanowhisker 20*e*. In an exemplary preferred embodiment, container-shaped first electrode 45 comprises any suitable electrically conductive material, whether existing or yet-to-be developed, and which is formed on nanowhisker 20*e*. Further, container-shaped first capacitor electrode 45 might comprise one or more electrically conductive materials, with titanium nitride being but one specific example.

Figure 15:
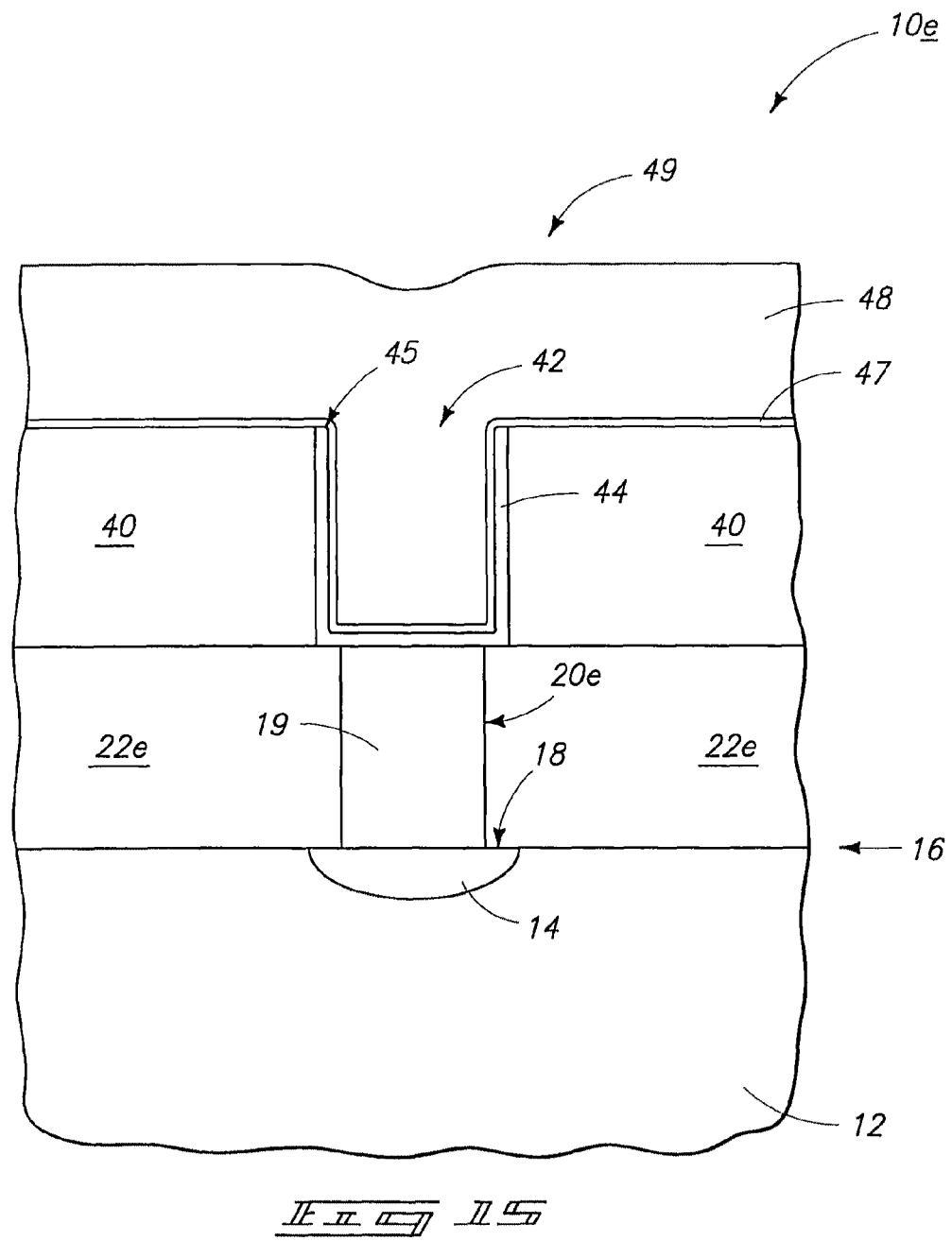
FIG. 15 is a view of the FIG. 14 substrate at a processing step subsequent to that depicted by FIG. 14.

Referring to FIG. 15, a capacitor dielectric layer 47 has been formed over container-shaped first capacitor electrode 45, and a second capacitor electrode 48 has been formed over capacitor dielectric layer 47, thus in the depicted example forming a capacitor 49.

The FIGS. 12-15 embodiment provides but one exemplary implementation whereby an electrically insulative material is formed about a nanowhisker 20*e* after such has been formed. Of course, the invention also contemplates where an electrically insulative layer is utilized in fabricating a capacitor involving growing a nanowhisker and forming a container-shaped first capacitor electrode in electrical connection therewith wherein the nanowhisker is grown within an opening of a previously formed electrically insulative material, for example and by way of example only, as described above in connection with the embodiments of FIGS. 8 and 9.

Figure 16:
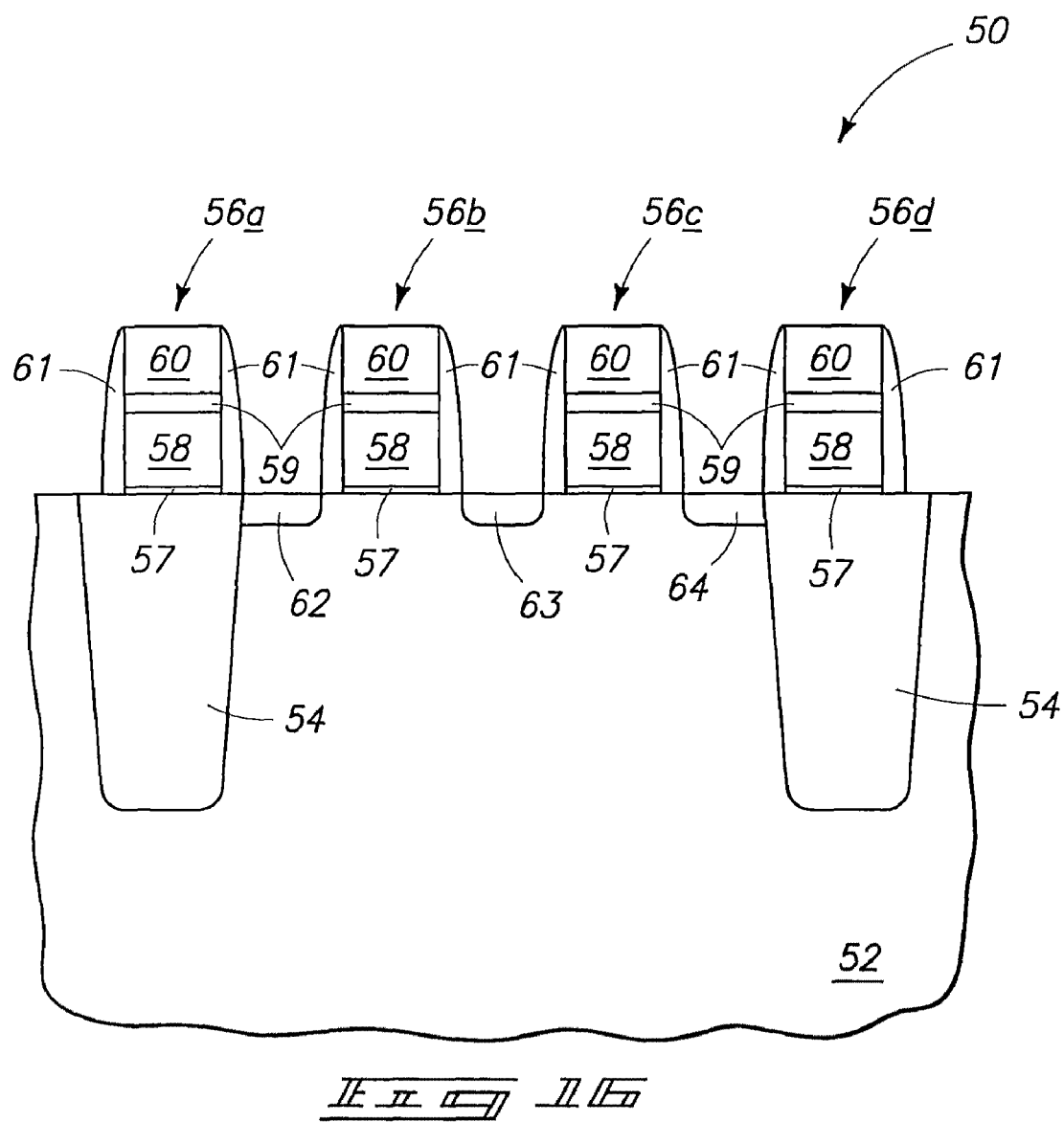
FIG. 16 is a view of another alternate embodiment substrate fragment.

Further by way of example only, exemplary embodiments of forming DRAM memory circuitry employing DRAM memory cells are next described in connection with FIGS. 16-20. Referring initially to FIG. 16, a semiconductor wafer fragment 50 is depicted. By way of example only, such comprises a bulk semiconductive material substrate 52, for example background-doped monocrystalline silicon. Shallow trench isolation regions 54 (i.e., comprising a composite of silicon dioxide and silicon nitride) have been formed within substrate material 52. Substrate fragment 50 is depicted as comprising a series of four wordlines 56*a*, 56*b*, 56*c* and 56*d*. By way of example only, the depicted wordline constructions are shown as comprising a suitable gate dielectric layer 57, an overlying semiconductive material layer 58 (i.e., conductively doped polysilicon), an overlying higher conductive material 59 (i.e., tungsten or tungsten silicide), and an overlying electrically insulative cap 60. Wordline constructions 56*a*-*d* are also depicted as comprising electrically insulative anisotropically etched sidewall spacers 61. Source/drain diffusion regions 62, 63 and 64 are formed within substrate material 52, with diffusion region 63 being formed between wordline pairs 56*b* and 56*d*; diffusion region 62 being formed between wordline pairs 56*a* and 56*b*; and diffusion region 64 being formed between wordline pairs 56*c* and 56*d*. In the depicted exemplary embodiment, diffusion region 63 exemplifies or comprises an exemplary bit line contact or bit line node, whereas diffusion regions 62 and 64 individually comprise separate capacitor storage node contacts formed operatively proximate wordlines 56*b* and 56*c*, respectively.

Figure 17:
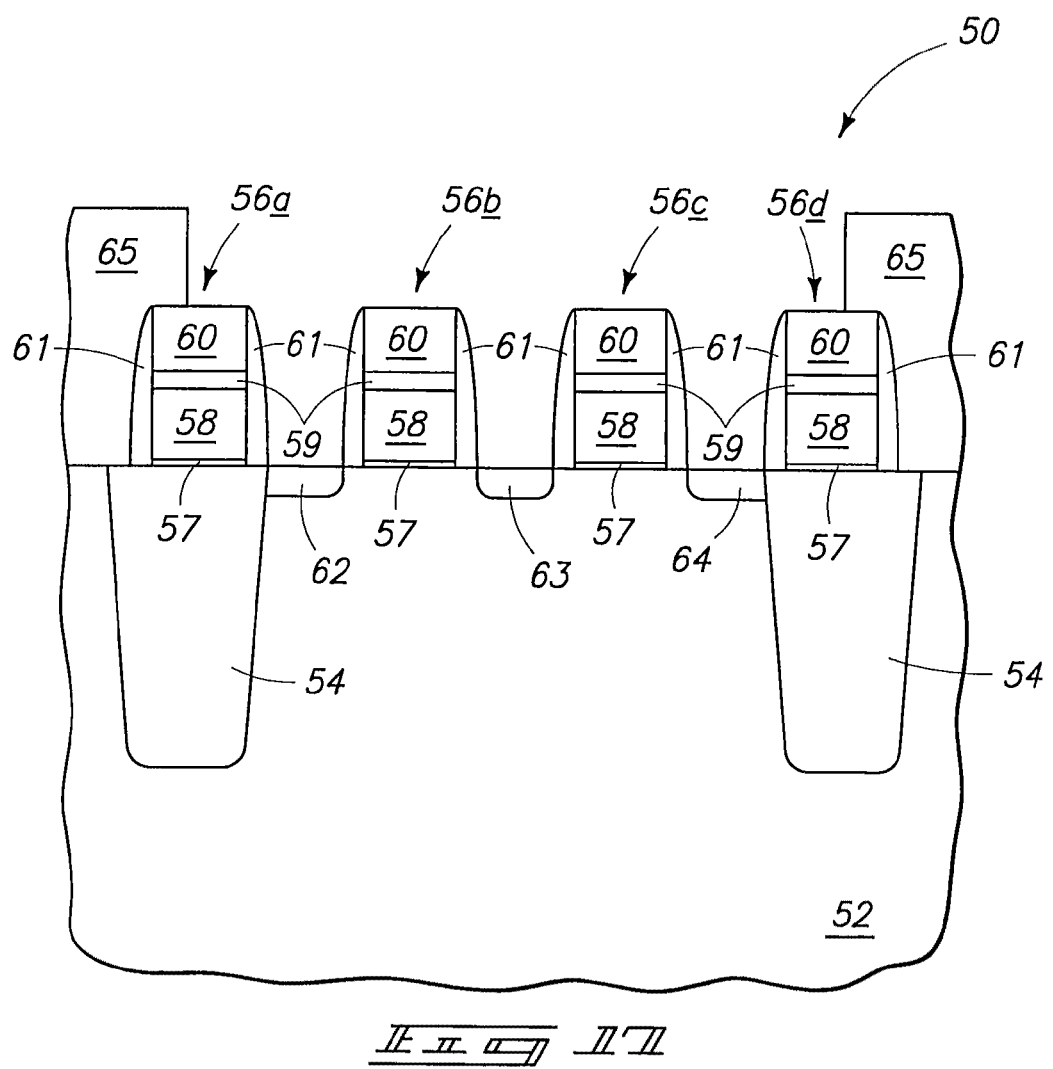
FIG. 17 is a view of the FIG. 16 substrate at a processing step subsequent to that depicted by FIG. 16.

FIG. 17 depicts an exemplary embodiment whereby some suitable masking layer 65 (which may or may not be sacrificial) has been formed over the substrate whereby capacitor storage node contacts 62 and 64, and bit node contact 63, are outwardly exposed. By way of example only, exemplary suitable materials include photoresist or doped or undoped silicon dioxide.

Figure 18:
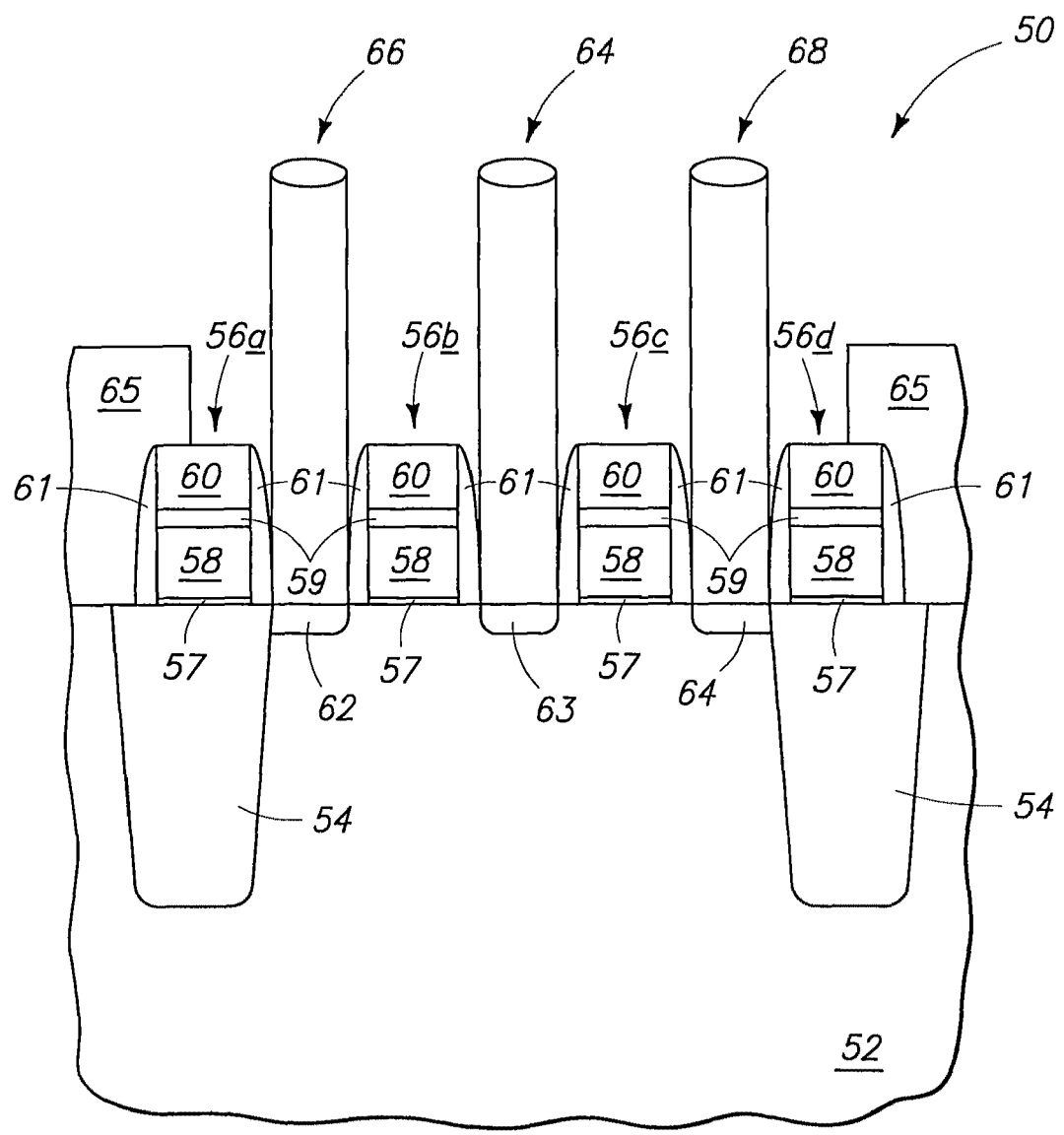
FIG. 18 is a view of the FIG. 17 substrate at a processing step subsequent to that depicted by FIG. 17.

Referring to FIG. 18, a first nanowhisker 64 has been grown from bit line contact 63, and second nanowhiskers 66 and 68 have been grown from capacitor storage node contacts 62 and 64, respectively, and such are ultimately provided to be electrically conductive, for example in manners of formation as described in the above first-described embodiments, and employing a suitable catalytic particle/material, as depicted. In the depicted exemplary embodiment, nanowhiskers 64, 66 and 68 have been grown to respective elevations outwardly of those of electrically insulative caps 60 and elevationally outwardly of the uppermost surfaces of anisotropically etched electrically insulative spacers 61. Further in the depicted exemplary embodiment, first nanowhisker 64 and second nanowhiskers 66 and 68 have been grown at the same time. Alternately by way of example only, first nanowhisker 64 and second nanowhiskers 66 and 68 might be grown at different times. For example and by way of example only, one or the other of bit line contact 63 or capacitor storage node contacts 62, 64 might be masked while nanowhiskers are grown from the unmasked diffusion regions of the other.

Figure 19:
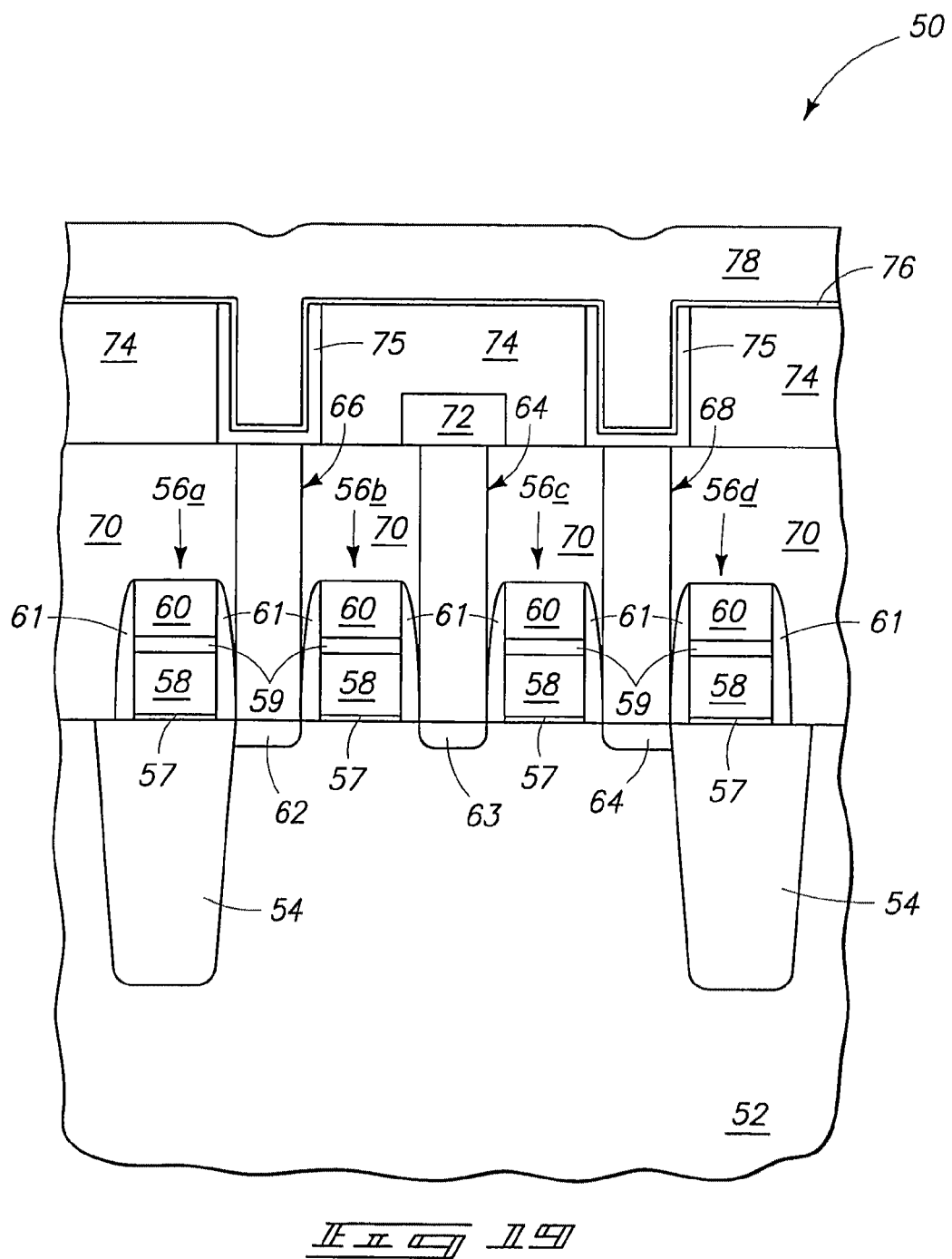
FIG. 19 is a view of the FIG. 18 substrate at a processing step subsequent to that depicted by FIG. 18.

FIG. 19, by way of example only, depicts subsequent processing in the fabrication of DRAM memory cells of DRAM integrated circuitry, whereby a bit line is formed in electrical contact with the first nanowhisker, and a capacitor dielectric layer and an outer capacitor electrode layer are formed over the second nanowhiskers. In such exemplary depicted preferred embodiment, material 65 (not shown) has been removed and an electrically insulative layer 70 has been formed about nanowhiskers 64, 66 and 68, and has been planarized relative thereto, which may or may not remove the catalytic particles/materials of grown nanowhiskers 64, 66 and 68. An exemplary preferred material 70 includes doped and undoped silicon dioxides, for example BPSG and/or undoped silicon dioxide deposited be decomposition of TEOS.

An exemplary bit line 72 is depicted as being formed in electrical contact with first nanowhisker 64. Subsequently, another electrically insulative layer 74 has been formed over the substrate. Material 74 might be of the same or different composition(s) as that of material 70. Openings have been formed within insulative material 74 to nanowhiskers 66 and 68. A capacitor dielectric layer 76 and an outer capacitor electrode layer 78 have been formed over respective second nanowhiskers 66 and 68. In the depicted preferred embodiment, intervening container-shaped inner capacitor electrodes 75 have been formed in electrical contact with second nanowhiskers 66 and 68, with capacitor dielectric layer 76 and outer capacitor electrode 78 being formed over such container-shaped inner capacitor electrodes. Accordingly in this particular exemplary embodiment, capacitor dielectric layer 76 is not formed on either of second nanowhiskers 66, 68. Further by way of example only in this particular embodiment, an example is depicted whereby a bit line is formed prior to forming the capacitor dielectric layer, and further by way of example only, comprises buried bit line architecture.

Figure 20:
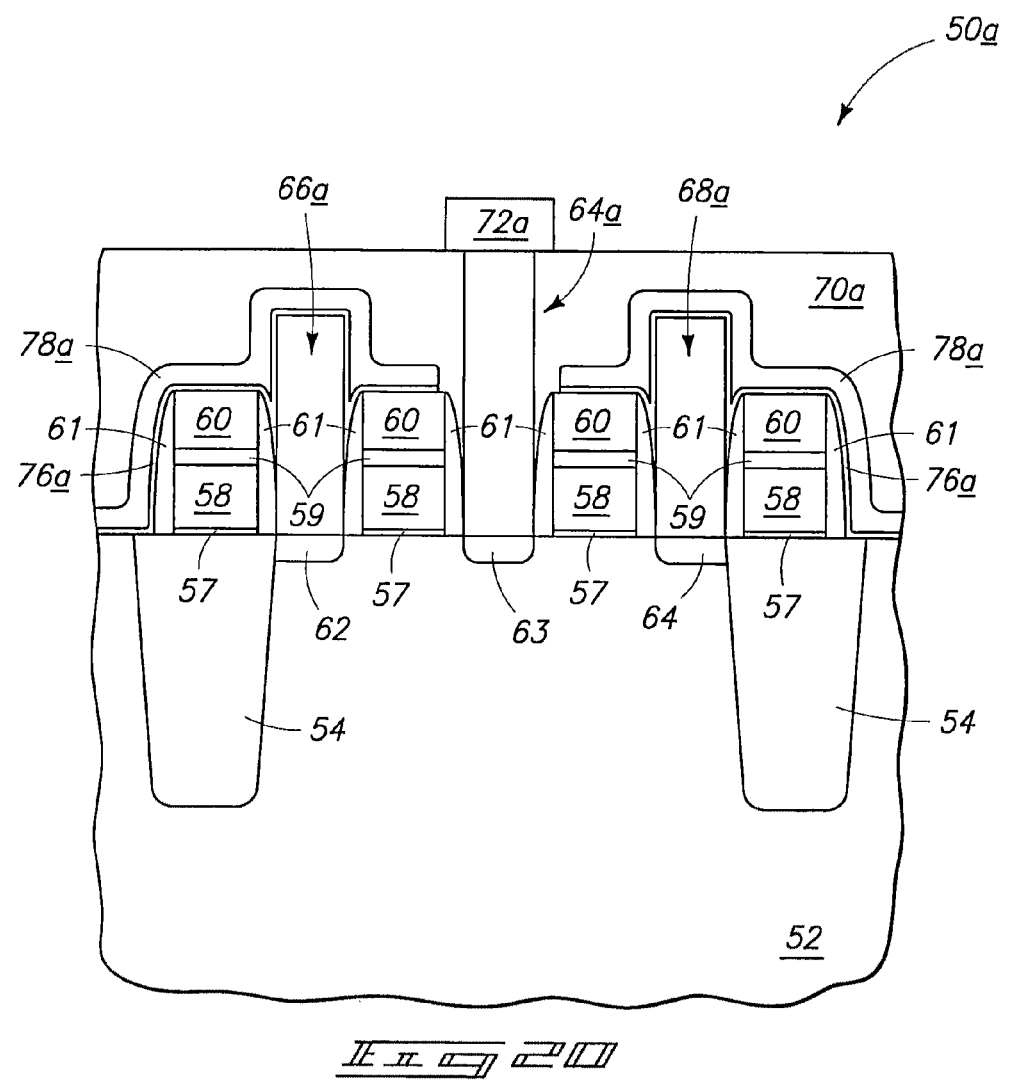
FIG. 20 is a view of another alternate embodiment substrate fragment.

Alternately by way of example only, an embodiment is depicted in FIG. 20 with respect to a wafer fragment 50*a*. Like numerals from the FIGS. 16-19 embodiment have been utilized where appropriate, with differences being indicated with the suffix "a" or with different numerals. FIG. 20 depicts a capacitor dielectric layer 76a which is formed on second nanowhiskers 66a and 68a, and also being formed on the sidewalls and tops of second nanowhiskers 66a, 68a, and with an outer capacitor electrode 78a being formed laterally over the depicted second nanowhisker sidewalls.

An insulative layer 70a has been formed over the depicted outer capacitor electrode(s) 78a, and an opening patterned therethrough and from within which a first nanowhisker 64a has been grown from bit node contact 63. A bit line 72a has been formed in electrical contact therewith. Accordingly in such embodiment, and by way of example only, a bit line 72a is formed after forming the capacitor dielectric layer, and also the outer sidewalls of grown nanowhiskers are utilized as capacitive surfaces.

The above-described exemplary embodiment methods of forming a DRAM memory cell encompassed nanowhisker growth from a bit line contact and from a capacitor storage node contact. However, aspects of the invention do contemplate nanowhisker growth from either a bit line contact or from a capacitor storage node contact independent of nanowhisker growth from the other. For example in one implementation, an aspect of the invention contemplates a method of forming an interconnect between a substrate bit line contact and a bit line in DRAM. Such a method comprises forming a bit line contact intermediate a pair of wordlines over a semiconductor substrate. A nanowhisker is grown from the bit line contact, and provided to be electrically conductive. A bit line is formed in electrical contact with the nanowhisker. Preferred implementations are otherwise as described above.

Further in one implementation, aspects of the invention encompass a method of forming a DRAM memory cell. Such a method comprises forming a wordline over a semiconductor substrate, and forming a capacitor storage node contact proximate the wordline. A nanowhisker is grown from the capacitor storage node contact, and provided to be electrically conductive. A capacitor dielectric layer and an outer capacitor electrode layer are formed over the nanowhisker. Preferred processing is otherwise as described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a DRAM memory cell, comprising:
    forming a wordline over a semiconductor substrate, and forming a capacitor storage node contact proximate the wordline;
    growing a nanowhisker to have at least two dimensions of about 100 nanometers or less from beneath a catalytic material and from the capacitor storage node contact, and providing the nanowhisker to be electrically conductive; and
    forming a capacitor dielectric layer and an outer capacitor electrode layer over the nanowhisker.

2. The method of claim 1 wherein the wordlines comprise electrically insulative caps, the nanowhisker being grown to an elevation outwardly of the electrically insulative caps.

3. The method of claim 1 wherein the wordlines comprise electrically insulative caps and anisotropically etched electrically insulative sidewall spacers, the nanowhisker being grown to an elevation outwardly of the electrically insulative caps and uppermost surfaces of said spacers.

4. The method of claim 1 comprising forming a container-shaped inner capacitor electrode in electrical contact with the nanowhisker, the capacitor dielectric layer and outer capacitor electrode being formed over the container-shaped inner capacitor electrode.

5. The method of claim 1 wherein the capacitor dielectric layer is not formed on the nanowhisker.

6. The method of claim 1 wherein the capacitor dielectric layer is formed on the nanowhisker.

7. The method of claim 1 wherein the nanowhisker comprises sidewalls, the capacitor dielectric layer being formed on said nanowhisker sidewalls, the outer capacitor electrode being formed laterally over the nanowhisker sidewalls.

8. The method of claim 1 wherein the nanowhisker is electrically conductive upon its growth.

9. The method of claim 8 wherein the nanowhisker is provided to be electrically conductive at least in part by doping with a conductivity enhancing dopant during the growing.

10. The method of claim 1 wherein the nanowhisker is provided to be electrically conductive after its growth.

11. The method of claim 10 wherein the nanowhisker is provided to be electrically conductive at least in part by doping with a conductivity enhancing dopant after its growth.

12. The method of claim 1 wherein the catalytic material remains as part of a finished circuitry construction comprising the nanowhisker.

13. The method of claim 1 comprising removing the catalytic material prior to forming the capacitor dielectric layer.

14. A method of forming a DRAM memory cell, comprising:
    forming a wordline over a semiconductor substrate, and forming a bit line contact and a capacitor storage node contact proximate the wordline;
    growing a first nanowhisker to have at least two dimensions of about 100 nanometers or less from beneath a catalytic material and from the bit line contact and growing a second nanowhisker to have at least two dimensions of about 100 nanometers or less from beneath a catalytic material and from the capacitor storage node contact, and providing the first and second nanowhiskers to be electrically conductive;
    forming a bit line in electrical contact with the first nanowhisker; and
    forming a capacitor dielectric layer and an outer capacitor electrode layer over the second nanowhisker.

15. The method of claim 14 wherein the first and second nanowhiskers are grown at the same time.

16. The method of claim 14 wherein the first and second nanowhiskers are grown at different times.

17. The method of claim 14 wherein the bit line is formed prior to forming the capacitor dielectric layer.

18. The method of claim 14 wherein the bit line is formed after forming the capacitor dielectric layer.

19. The method of claim 14 wherein the wordlines comprise electrically insulative caps, the first and second nanowhiskers being grown to an elevation outwardly of the electrically insulative caps.

20. The method of claim 14 wherein the wordlines comprise electrically insulative caps and anisotropically etched electrically insulative sidewall spacers, the first and second nanowhiskers being grown to an elevation outwardly of the electrically insulative caps and uppermost surfaces of said spacers.

21. The method of claim 14 comprising forming a container-shaped inner capacitor electrode in electrical contact with the second nanowhisker, the capacitor dielectric layer and outer capacitor electrode being formed over the container-shaped inner capacitor electrode.

22. The method of claim 14 wherein the capacitor dielectric layer is not formed on the second nanowhisker.

23. The method of claim 14 wherein the capacitor dielectric layer is formed on the second nanowhisker.

24. The method of claim 14 wherein the second nanowhisker comprise sidewalls, the capacitor dielectric layer being formed on said second nanowhisker sidewalls, the outer capacitor electrode being formed laterally over the second nanowhisker sidewalls.

25. The method of claim 14 wherein the first and second nanowhiskers are electrically conductive upon growth.

26. The method of claim 25 wherein the first and second nanowhiskers are provided to be electrically conductive at least in part by doping with a conductivity enhancing dopant during their growing.

27. The method of claim 14 wherein the first and second nanowhiskers are provided to be electrically conductive after growth.

28. The method of claim 27 wherein the first and second nanowhiskers are provided to be electrically conductive at least in part by doping with a conductivity enhancing dopant after their growth.

29. The method of claim 14 wherein at least some of the catalytic material from beneath which the first nanowhisker is grown and at least some of the catalytive material from beneath which the second nanowhisker is grown remain as part of a finished circuitry construction comprising the first and second nanowhiskers.

30. The method of claim 14 comprising removing the catalytic material from beneath which the first nanowhisker is grown from the first nanowhisker prior to forming the bit line, and removing the catalytic material from beneath which the second nanowhisker is grown from the second nanowhisker prior to forming the capacitor dielectric layer.

31. The method of claim 14 comprising forming the bit line contact between the wordline and another wordline.

\* \* \* \* \*

UNITED STATES PATENT AND TRADEMARK OFFICE
CERTIFICATE OF CORRECTION

| | | |
|---|---|---|
| PATENT NO. | : 8,030,168 B2 | Page 1 of 1 |
| APPLICATION NO. | : 12/419014 | |
| DATED | : October 4, 2011 | |
| INVENTOR(S) | : Brett W. Busch et al. | |

It is certified that error appears in the above-identified patent and that said Letters Patent is hereby corrected as shown below:

In column 12, line 7, in Claim 29, delete "catalytive" and insert -- catalytic --, therefor.

Signed and Sealed this
Sixth Day of December, 2011

David J. Kappos
*Director of the United States Patent and Trademark Office*